(12) United States Patent
Lee

(10) Patent No.: US 9,099,832 B2
(45) Date of Patent: Aug. 4, 2015

(54) LASER OPTIC MODULE

(71) Applicant: HYUNDAI MOBIS CO., LTD., Seoul (KR)

(72) Inventor: Tae Won Lee, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 98 days.

(21) Appl. No.: 14/106,496

(22) Filed: Dec. 13, 2013

(65) Prior Publication Data

US 2015/0138774 A1 May 21, 2015

(30) Foreign Application Priority Data

Nov. 21, 2013 (KR) .......................... 10-2013-0142365

(51) Int. Cl.
*H01S 3/00* (2006.01)
*H01S 5/00* (2006.01)
*H01S 3/04* (2006.01)

(52) U.S. Cl.
CPC ............... *H01S 3/005* (2013.01); *H01S 3/0405* (2013.01)

(58) Field of Classification Search
CPC ............................. H01S 3/005; H01S 3/0405
USPC ........................................ 362/84, 259, 294
See application file for complete search history.

(56) References Cited

U.S. PATENT DOCUMENTS

| 2009/0059598 | A1 | 3/2009 | Pruss et al. |
| 2010/0308354 | A1 | 12/2010 | David et al. |
| 2013/0027964 | A1 | 1/2013 | Toyota et al. |
| 2013/0128584 | A1* | 5/2013 | Koike et al. .................... 362/259 |

FOREIGN PATENT DOCUMENTS

| JP | 2012-203995 A | 10/2012 |
| JP | 2013-026162 A | 2/2013 |
| JP | 2013-149449 A | 8/2013 |
| KR | 10-2013-0106394 A | 9/2013 |

OTHER PUBLICATIONS

Office Action dated Aug. 22, 2014 of corresponding Korean Patent Application No. 10-2013-0142365—4 pages.

* cited by examiner

*Primary Examiner* — David V Bruce
(74) *Attorney, Agent, or Firm* — Knobbe Martens Olson & Bear, LLP

(57) ABSTRACT

Provided is a laser optic module including: a laser light source which generates laser light; a beam guide which includes a light path whose side wall is a reflective surface to introduce the laser light into the light path to guide the laser light; and a fluorescent substance which is provided at a point where the light path of the beam guide ends and emits fluorescence by the laser light, in which a width of the light path is formed by a full width at half maximum (FWHM) of the laser light in a position where the laser light is incident onto the fluorescent substance. Therefore, the laser light is directly used to improve luminance efficiency and reduce a size by adopting a simple structure.

12 Claims, 9 Drawing Sheets

Laser Emitting Point

LASER OPTIC MODULE

CROSS-REFERENCE TO RELATED APPLICATIONS

This application claims priority to and the benefit of Korean Patent Application No. 10-2013-0142365 filed in the Korean Intellectual Property Office on Nov. 21, 2013, the entire contents of which are incorporated herein by reference.

TECHNICAL FIELD

The present invention relates to a laser optic module, and more particularly, to a laser optic module which directly uses laser light to improve luminance efficiency and reduce a size by adopting a simple structure.

BACKGROUND ART

A laser diode is an element which uses a semiconductor to generate a laser and has a characteristic in that the laser diode has a small driving current due to a small size to easily generate and modulate the laser light.

The laser diode is widely used for medical purpose and industrial purpose but there is no product which has been mass-produced in a field of a lamp for a vehicle. Some advanced companies have developed a laser optic module for a lamp for a vehicle, but a technology which uses the laser as a light source for a vehicle has not yet been propagated because it is an initial stage.

An optic module for a vehicle using a laser diode which has been disclosed in recent years has a complex structure and specifically sizes of a laser diode and a heat sink for radiating heat are large so that it is difficult to apply the optic module for a vehicle to an actual vehicle. Even though there is a method which uses an optical fiber in order to solve the above-mentioned problem, cost is increased and efficiency is lowered.

Patent Document: US Patent Publication No. 2013-0027964 (published on Jan. 31, 2013)

SUMMARY OF THE INVENTION

The present invention has been made in an effort to provide a laser optic module which directly uses laser light to improve luminance efficiency and reduce a size by adopting a simple structure.

An exemplary embodiment of the present invention provides a laser optic module, including: a laser light source which generates laser light, a beam guide which includes a light path whose side wall is a reflective surface to introduce the laser light into the light path to guide the laser light; and a fluorescent substance which is provided at a point where the light path of the beam guide ends and emits fluorescence by the laser light, in which a width of the light path is formed by a full width at half maximum (FWHM) of the laser light in a position where the laser light is incident onto the fluorescent substance.

The laser optic module may further include a short pass filter (SPF) which is provided on an incident surface of the fluorescent substance.

The short pass filter may pass through the laser light or reflect fluorescence generated from the fluorescent substance.

The laser light may be blue light and the fluorescent substance may be a yellow fluorescent substance.

An inclined portion which is inclined at a predetermined angle so as to reduce an angle at which the laser light is reflected to be incident onto the short pass filter may be formed at a starting point of the light path of the beam guide.

The inclined portion may be inclined at a predetermined angle such that an incident angle at which the laser light is reflected onto an inner side wall of the light path to be incident onto the short pass filter is smaller than a maximum incident angle at which 95% or more of a transmittance of the short pass filter is satisfied at a wavelength band of the laser light.

The beam guide may include a first body part; and a second body part which is coupled to the first body part so as to form the light path between the first body part and the second body part.

The first body part and the second body part may be provided so as to have a mutually symmetrical shape.

The first body part may have a protruding guide which is provided so as to protrude on a surface which is in contact with the second body part, and the second body part may have an insertion groove into which the protruding guide is inserted, in a portion corresponding to the protruding guide.

The reflective surface of the light path may be formed by deposition of aluminum.

The laser light source may be a laser diode.

The laser optic module may further include a heat sink which securely holds the laser light source and the beam guide and absorbs heat radiated from the laser light source and the beam guide.

According to the laser optic module of the present invention, laser light is directly used to improve luminance efficiency and reduce a size by adopting a simple structure.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
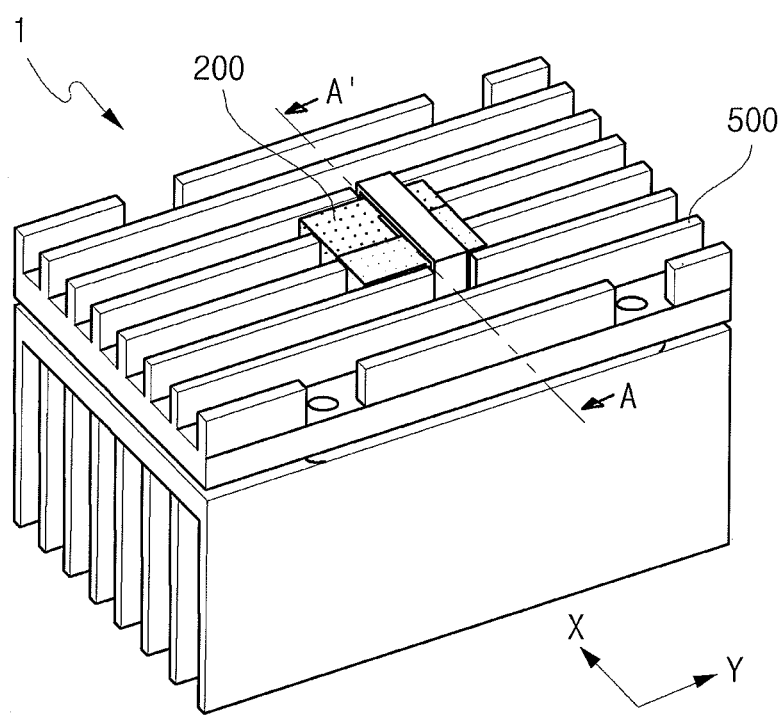
FIG. 1 is a perspective view of a laser optic module according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

Hereinafter, exemplary embodiments of the present invention will be described in detail with reference to the accompanying drawings. In the figures, it should be noted that even though the parts are illustrated in different drawings, it should be understood that like reference numerals refer to like parts of the present invention throughout the several figures of the drawing. Hereinafter, exemplary embodiments of the present invention will be described. However, it should be understood that the technical spirit of the invention is not limited to the specific embodiments, but may be changed or modified in various ways by those skilled in the art.

Figure 2:
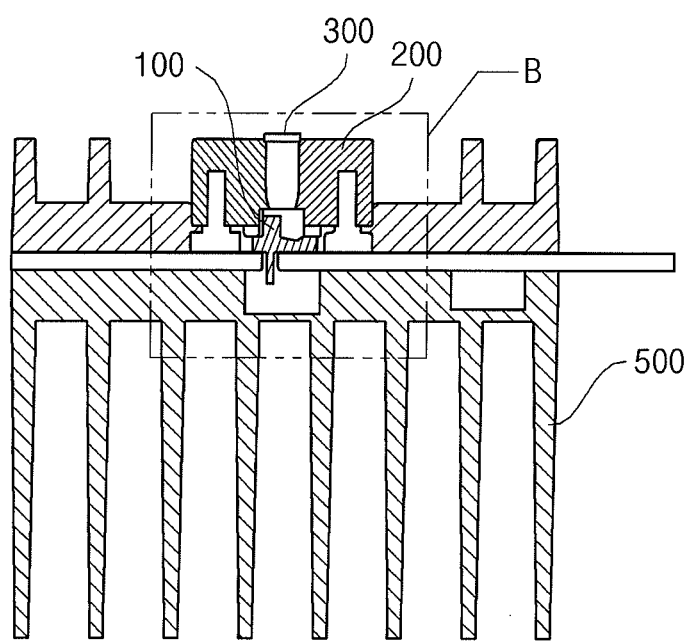
FIG. 2 is a cross-sectional view taken along the line A-A' of FIG. 1.
Figure 3:
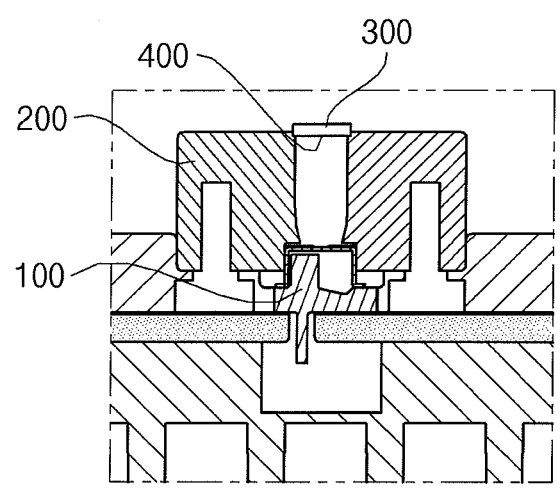
FIG. 3 is an enlarged view of a main part of FIG. 2.
Figure 4:
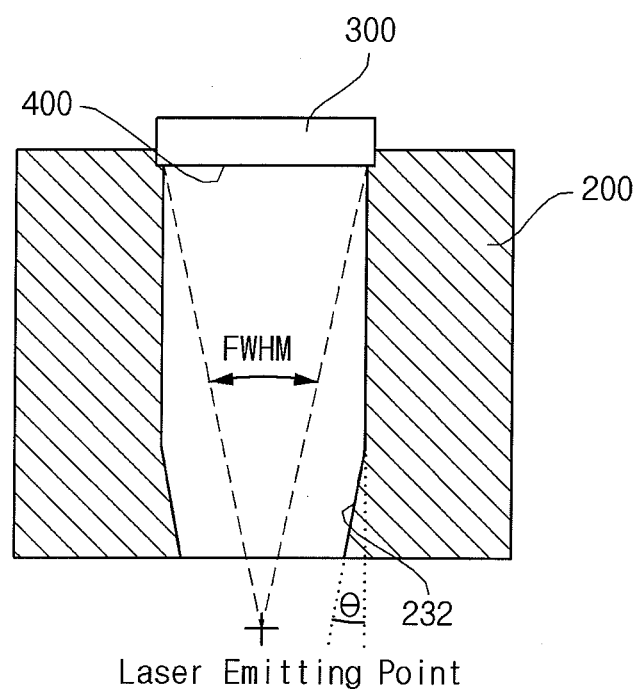
FIG. 4 is a diagram illustrating an internal structure of a beam guide of FIG. 3.

FIG. 1 is a perspective view of a laser optic module according to an exemplary embodiment of the present invention, FIG. 2 is a cross-sectional view taken along the line A-A' of FIG. 1, FIG. 3 is an enlarged view of a main part of FIG. 2, and FIG. 4 is a diagram illustrating an internal structure of a beam guide of FIG. 3.

Referring to FIGS. 1 to 4, a laser optic module according to an exemplary embodiment of the present invention includes a laser light source, a beam guide, a fluorescent substance, a short pass filter, and a heat sink.

The laser light source generates laser light. In this exemplary embodiment, a laser diode is provided as the laser light source.

The laser light which is generated in the laser light source shows Gaussian distribution in which an intensity of a center portion is strong and is forwardly irradiated. A full width at half maximum (FWHM) refers to a width where an intensity is a half of a maximum intensity of the center portion in an intensity distribution of the laser light. The laser light which is generated in the laser light source is spread while forwardly proceeding so that as a distance from the laser light source is farther, a FWHM of the laser light which reaches that position is increased. Therefore, the FWHM may be represented as an irradiation angle to a direction in which the laser light is irradiated from the laser light source.

That is, as illustrated in FIG. 4, the FWHM of the laser light is formed along a predetermined irradiation angle in a direction in which the laser light is irradiated at a point (a laser emitting point) at which the laser light is generated.

In the beam guide, a light path in which a side wall is a reflective surface is formed inside so that the laser light is introduced into the light path to be guided. Referring to FIGS. 3 and 4, the laser emitting point is disposed at a center axis of the light path and the laser light is irradiated from this point to the light path.

The fluorescent substance is provided at a point where the light path of the beam guide ends. The fluorescent substance absorbs the laser light to generate fluorescence. Therefore, the laser light which passes through the fluorescent substance is mixed with the fluorescence generated from the fluorescent substance to generate white light.

Specifically, in this exemplary embodiment, blue light is used as the laser light and a yellow fluorescent substance is used as the fluorescent substance. The blue light which is the laser light and yellow light which is generated from the fluorescent substance are mixed to generate white light. However, the present invention is not limited thereto and other types of laser light and the fluorescent substance may be used.

In the beam guide, a width of the light path is formed in a position where the laser light is incident into the fluorescent substance in accordance with the FWHM of the laser light. Referring to FIG. 4, the FWHM on the incident surface of the fluorescent substance is determined as a width of the light path along an FWHM angular line of the laser light which is represented as an irradiation angle.

When the width of the light path is formed to be the FWHM of the laser light on the incident surface of the fluorescent substance, surrounding laser light which is deviated by the FWHM from the incident surface of the fluorescent substance is reflected from an inner side wall reflective surface of the light path to be incident onto the fluorescent substance. Accordingly, when the laser light is incident onto the fluorescent substance, the intensity distribution of the laser light on the incident surface of the fluorescent substance has a flat distribution with a small deviation, which will be described in detail below with reference to FIG. 5.

Figure 5:
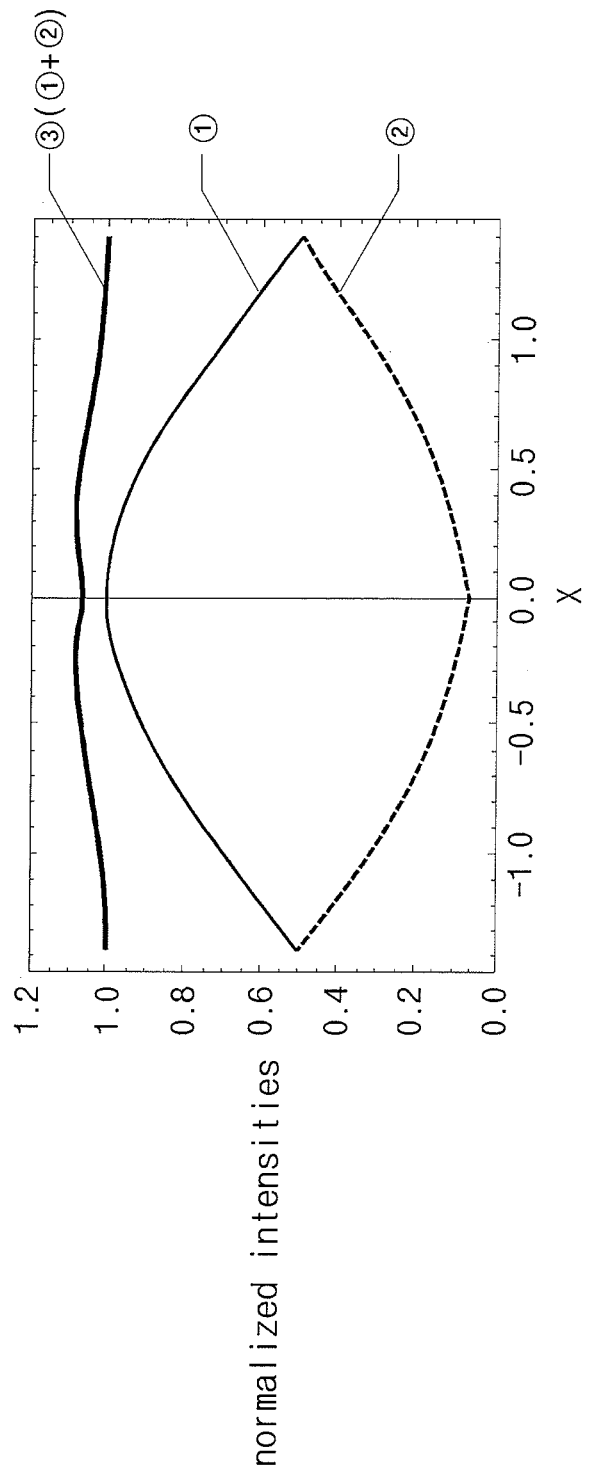
FIG. 5 is a graph illustrating an intensity distribution of laser light which is changed after passing through a beam guide.

FIG. 5 is a graph illustrating an intensity distribution of the laser light on the incident surface of the fluorescent substance. In FIG. 5, a curve (1) indicates an intensity distribution of laser light which is directly incident onto the fluorescent substance in accordance with Gaussian distribution and a curve (2) indicates a curve indicating an intensity when laser light which is deviated from the FWHM, at a edge is reflected from the reflective surface of the inner side wall of the light path to be incident onto the fluorescent substance. The intensity distribution of the laser light on the incident surface of the fluorescent substance is a sum of the curve (1) and the curve (2) and thus the distribution has a flat distribution with a small deviation as represented by a curve (3) in FIG. 5.

As described above, if the width of the light path is the FWHM of the laser light on the incident surface of the fluorescent substance, when the laser light is incident onto the fluorescent substance, the intensity distribution of the laser light on the incident surface of the fluorescent substance has a flat distribution with a small deviation.

If the laser light having a Gaussian distribution in which an intensity at the center portion is strong is incident onto the fluorescent substance, fluorescent efficiencies at the center portion and a border portion of the fluorescent substance are different from each other, which may reduce the luminance efficiency as a whole. Accordingly, the beam guide of the present invention is applied so that the laser light is incident onto the incident surface of the fluorescent substance with a flat intensity as illustrated by the curve (3) of FIG. 5, which may improve the luminance efficiency in the fluorescent substance.

The width of the light path becomes the FWHM of the laser light on the incident surface of the fluorescent substance so that a length of the beam guide which may form a flat intensity distribution of the laser light on the incident surface of the fluorescent substance is minimized, which may reduce a size of the beam guide.

Referring to FIGS. 3 and 4, the short pass filter (SPF) is provided on the incident surface of the fluorescent substance. The short pass filter has a characteristic which passes through light having a short wavelength and reflects light having a long wavelength. The laser light has a short wavelength as compared with fluorescence which is generated in the fluorescent substance so that the short pass filter is provided so as to pass through the laser light but reflect the fluorescence which is generated from the fluorescent substance.

The fluorescence which absorbs the laser light to be generated from the fluorescent substance does not propagate in the same direction as the laser light but is scattered in an arbitrary direction. When the fluorescence generated from the fluorescent substance is directed to the incident surface of the fluorescent substance, the short pass filter which is provided on the incident surface of the fluorescent substance reflects the fluorescence to propagate in the same direction as the laser light so that the luminance efficiency of the laser optic module may be improved.

Specifically, in this exemplary embodiment, a cut-off of the short pass filter has a value between 480 and 500 nm, the laser light is blue light and has a wavelength of approximately 450 nm and the fluorescence which is generated from the fluorescent substance is yellow light and has a wavelength of approximately 550 nm. Accordingly, the laser light passes through the short pass filter and the fluorescence which is generated from the fluorescent substance is reflected from the short pass filter.

In the meantime, the transmittance of the short pass filter may vary depending on not only the wavelength of light but also the incident angle of the light.

Figure 6:
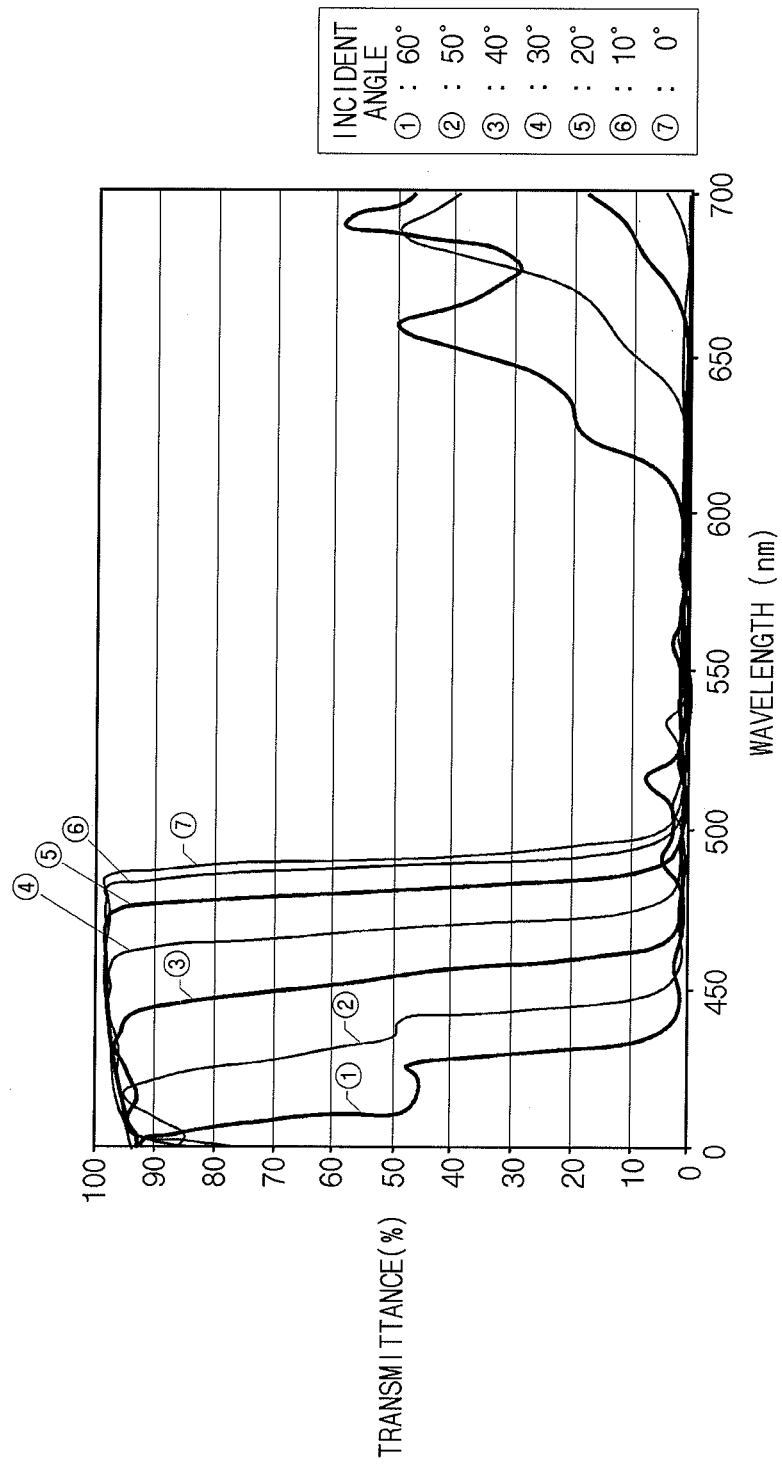
FIG. 6 is graph illustrating a transmittance characteristic of a short pass filter.

FIG. 6 is graph illustrating a transmittance characteristic of a short pass filter.

Referring to FIG. 6, when laser light having a wavelength of 450 nm is incident onto a short pass filter in the exemplary embodiment, an incident angle needs to be smaller than approximately 30 degrees in order to achieve a transmittance of 95% or more. That is, a maximum incident angle at which the laser light having a wavelength of 450 nm satisfies 95% or more of a transmittance of the short pass filter is approximately 30 degrees.

Figure 7:
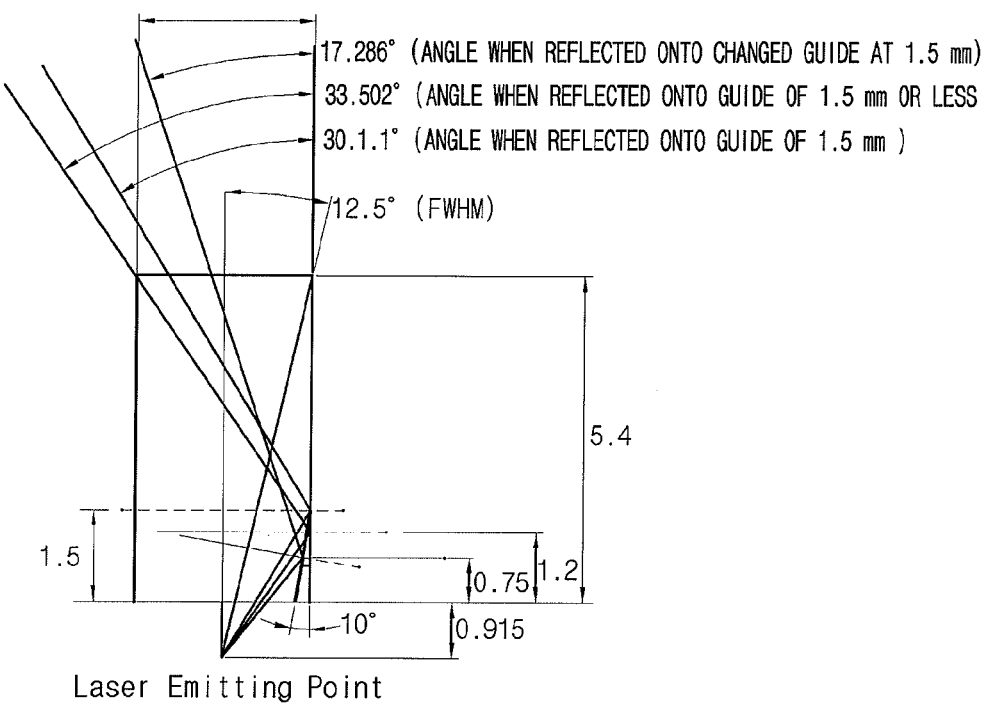
FIG. 7 is a diagram illustrating a reflection angle of laser light in a beam guide.

When the laser light is incident onto the short pass filter at an angle larger than the maximum incident angle which satisfies 95% or more of the transmittance of the short pass filter, the laser light is blocked, which may lower the luminance efficiency. Accordingly, if an angle at which the laser light is incident onto the short pass filter is large, an inclined portion which is inclined at a predetermined angle to reduce an angle at which the laser light is reflected to be incident onto the short pass filter is formed at a starting point of the light path of the beam guide to improve the luminance efficiency. FIG. 7 is a diagram illustrating a reflection angle of the laser light in the beam guide when the FWHM of the laser light is formed at 25 degrees.

Referring to FIG. 7, when no inclined portion is provided, the laser light is reflected from the reflective surface so that an incident angle onto the short pass filter is at 33.5 degrees at maximum but when the inclined portion is formed, the laser light is reflected from the inclined portion so as to be incident onto the short pass filter at 30 degrees or less. Therefore, the inclined portion may be formed to be inclined at a predetermined angle such that an incident angle at which the laser light is reflected from the internal side wall of the light path to be incident onto the short pass filter is smaller than the maximum incident angle which satisfies 95% or more of transmittance of the short pass filter at a wavelength band of the laser light in accordance with the FWHM.

Figure 8A:
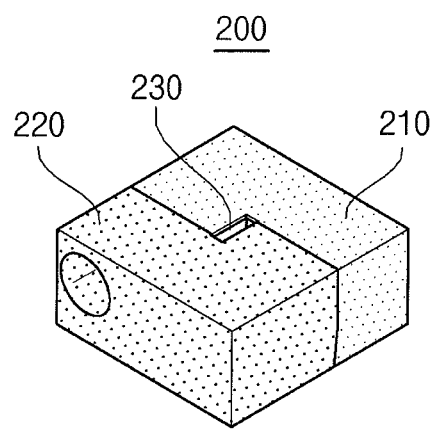
FIGS. 8A and 8B are a perspective view and a plan view of a beam guide of FIG. 1.
Figure 8B:
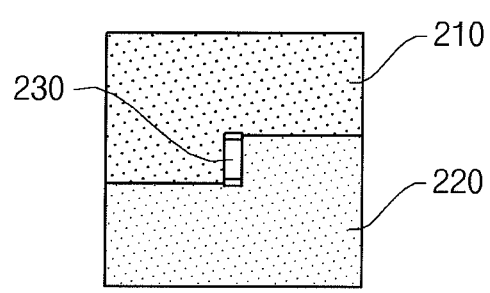
Figure 9:
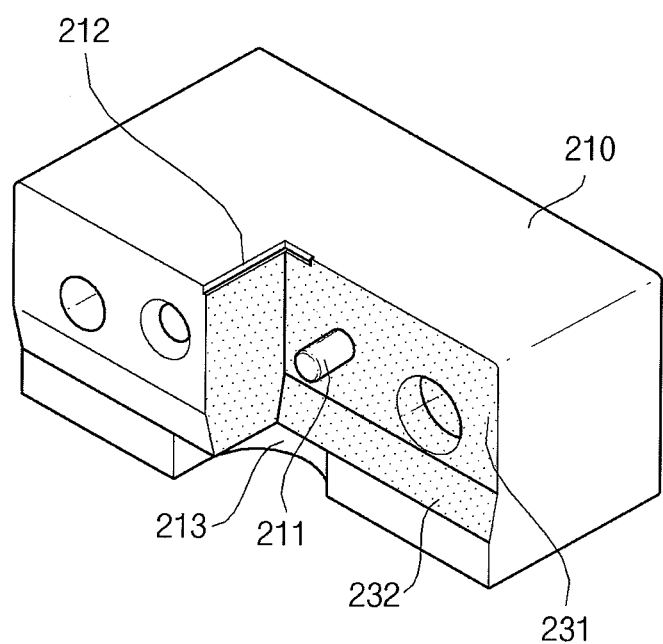
FIG. 9 is a perspective view of a first body part of the beam guide.

FIGS. 8A and 8B are a perspective view and a plan view of a beam guide of FIG. 1 and FIG. 9 is a perspective view of a first body part of the beam guide.

Referring to FIGS. 8A, 8B, and 9, the beam guide includes a first body part and a second body part which is coupled to the first body part so as to form a light path between the first body part and the second body part. That is, the beam guide is manufactured by coupling the first body part and the second body part and the light path is formed at an interface at which the first body part and the second body part are coupled.

The beam guide is manufactured by separately forming the first body part and the second body part so that it is easy to manufacture the light path and a reflective surface.

The first body part and the second body part are provided so as to have a mutually symmetrical shape. Accordingly, the first body part and the second body part are easily coupled to each other.

The first body part has a protruding guide which protrudes from one surface which is in contact with the second body part and the second body part has an insertion groove into which the protruding guide is inserted, in a portion corresponding to the protruding guide. By doing this, when the first body part and the second body part are coupled to each other, an assembling job is easily performed.

Referring to FIG. 9, the reflective surface including a surface of the first body portion on which the light path is formed is widely formed so as to easily finish the reflective surface. The reflective surface is formed by the deposition of aluminum.

The heat sink securely holds the laser light and the beam guide and absorbs the heat emitted from the laser light source and the beam guide.

As described above, according to the laser optic module of the present invention, laser light is directly used to improve luminance efficiency and reduce a size by adopting a simple structure. The short pass filter is applied to improve the luminance efficiency and the beam guide is manufactured by separately forming the body parts so that the manufacturing and assembling processes are easily performed.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A laser optic module, comprising:
   a laser light source which generates laser light;
   a beam guide which includes a light path whose side wall is a reflective surface to introduce the laser light into the light path to guide the laser light; and
   a fluorescent substance which is provided at a point where the light path of the beam guide ends and emits fluorescence by the laser light,
   wherein a width of the light path is formed by a full width at half maximum (FWHM) of the laser light in a position where the laser light is incident onto the fluorescent substance.

2. The laser optic module of claim 1, further comprising:
   a short pass filter (SPF) which is provided on an incident surface of the fluorescent substance.

3. The laser optic module of claim 2, wherein the short pass filter passes through the laser light or reflects fluorescence which is generated from the fluorescent substance.

4. The laser optic module of claim 1, wherein the laser light is blue light and the fluorescent substance is a yellow fluorescent substance.

5. The laser optic module of claim 2, wherein an inclined portion which is inclined at a predetermined angle so as to reduce an angle at which the laser light is reflected to be incident onto the short pass filter is formed at a starting point of the light path of the beam guide.

6. The laser optic module of claim 5, wherein the inclined portion is inclined at a predetermined angle such that an incident angle at which the laser light is reflected onto an inner side wall of the light path to be incident onto the short pass filter is smaller than a maximum incident angle at which 95% or more of a transmittance of the short pass filter is satisfied at a wavelength band of the laser light.

7. The laser optic module of claim 1, wherein the beam guide includes
 a first body part; and
 a second body part which is coupled to the first body part so as to form the light path between the first body part and the second body part.

8. The laser optic module of claim 7, wherein the first body part and the second body part are provided so as to have a mutually symmetrical shape.

9. The laser optic module of claim 7, wherein the first body part has a protruding guide which is provided so as to protrude on a surface which is in contact with the second body part, and
 the second body part has an insertion groove into which the protruding guide is inserted, in a portion corresponding to the protruding guide.

10. The laser optic module of claim 1, wherein the reflective surface of the light path is formed by deposition of aluminum.

11. The laser optic module of claim 1, wherein the laser light source is a laser diode.

12. The laser optic module of claim 1, further comprising:
 a heat sink which securely holds the laser light source and the beam guide and absorbs heat radiated from the laser light source and the beam guide.

\* \* \* \* \*